US007467364B2

(12) United States Patent
Hekmatpour

(10) Patent No.: US 7,467,364 B2
(45) Date of Patent: *Dec. 16, 2008

(54) DATABASE MINING METHOD AND COMPUTER READABLE MEDIUM CARRYING INSTRUCTIONS FOR COVERAGE ANALYSIS OF FUNCTIONAL VERIFICATION OF INTEGRATED CIRCUIT DESIGNS

(75) Inventor: Amir Hekmatpour, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 399 days.

This patent is subject to a terminal disclaimer.

(21) Appl. No.: 11/299,497

(22) Filed: Dec. 12, 2005

(65) Prior Publication Data

US 2006/0107141 A1     May 18, 2006

Related U.S. Application Data

(63) Continuation of application No. 10/706,228, filed on Nov. 12, 2003, now Pat. No. 7,007,251.

(51) Int. Cl.
    *G06F 17/50*     (2006.01)
(52) U.S. Cl. .............................. 716/5; 716/4
(58) Field of Classification Search .................. 716/4–6
See application file for complete search history.

(56) References Cited

U.S. PATENT DOCUMENTS

| | | | |
|---|---|---|---|
| 5,910,899 A | 6/1999 | Barrientos | 364/491 |
| 6,132,109 A | 10/2000 | Gregory et al. | 395/704 |
| 6,182,258 B1 | 1/2001 | Hollander | 714/739 |
| 6,212,650 B1 | 4/2001 | Guccione | 714/32 |
| 6,212,667 B1 * | 4/2001 | Geer et al. | 716/6 |
| 6,347,388 B1 * | 2/2002 | Hollander | 714/739 |
| 6,647,513 B1 * | 11/2003 | Hekmatpour | 714/37 |
| 6,675,138 B1 * | 1/2004 | Hollander et al. | 703/13 |
| 7,007,251 B2 * | 2/2006 | Hekmatpour | 716/4 |
| 7,320,090 B2 * | 1/2008 | Coulter et al. | 714/30 |
| 2004/0006751 A1 * | 1/2004 | Kawabe et al. | 716/4 |

FOREIGN PATENT DOCUMENTS

EP      1 063 599 A2     12/2000

\* cited by examiner

*Primary Examiner*—Jack Chiang
*Assistant Examiner*—Binh C Tat
(74) *Attorney, Agent, or Firm*—Joscelyn G. Cockburn; James A. Lucas; Driggs, Hogg, Daugherty & Del Zoppo Co., LPA

(57) ABSTRACT

Database mining, analysis and optimization techniques in conjunction with the model-based functional coverage analysis are used to turn raw verification and coverage data into design intelligence (DI) and verification intelligence (VA). The required data and attributes are automatically extracted from verification, simulation and coverage analysis databases. Design finite state machine extraction, design functional event extraction, and automatic coverage model generation and optimization techniques are applied to the design HDL description. Coverage model tuning and optimization directives, as well as test spec tuning and optimization directives are generated based on the analysis and mining of various verification, simulation, and coverage databases. An integrated web-based interface portlet is used for access, analysis and management of the resulting databases, generated reports and verification directives. Dissemination rules are used to automatically generate and distribute analysis reports and verification directives to engineers at wired or wireless interface devices via Internet or Intranet.

15 Claims, 2 Drawing Sheets

An overview of the System Architecture

DATABASE MINING METHOD AND COMPUTER READABLE MEDIUM CARRYING INSTRUCTIONS FOR COVERAGE ANALYSIS OF FUNCTIONAL VERIFICATION OF INTEGRATED CIRCUIT DESIGNS

RELATED APPLICATION

This application is a continuation of application Ser. No. 10/706,228, filed Nov. 12, 2003.

FIELD OF THE INVENTION

This invention relates to analysis and verification of functional features of complex integrated circuit designs, such as processor cores, embedded microprocessors, and high performance microprocessors.

BACKGROUND OF THE INVENTION

Microprocessor verification is an important part and the bottleneck of the microprocessor design process. There is no practical method to test and verify all functional states of a complex microprocessor. A variety of techniques are used to generate test programs (i.e. tests) and to use these to verify the design's intended functionality. These include deterministic tests manually generated by engineers, tests generated by automatic test generators, such as IBM's Genesys and GenesysPro random test generators, standard test benches, or a combination of all techniques. In all cases, test programs are simulated against the design model to identify faulty functions.

One major issue that must be addressed is whether all functions of the processor have been tested and/or verified. If not, which ones have been missed. This information should be available in a timely manner so resources can be directed to verify functions that have been missed.

It is also very important to know promptly which functions have already been verified so that duplications are reduced and resources are targeted towards untested functions. Verification resources include verification engineers, test generators, simulation computers' capacity (i.e. simulation cycles) and debugging resources, just to name a few.

As the complexity of integrated circuit designs increase, so do the number and complexity of test programs to be generated and simulated. This, in turn, requires more resources to simulate and debug the functions that fail. The following questions need to be answered in order to decide whether the design has been verified or not:

1) Has everything detailed in the test plan been verified. If not, what are the remaining functions to be verified (functional coverage holes);

2) Have all new scenarios/states not planned for in the test plan been verified; and 3) Where should the attention/resources be focused to ensure the best coverage of verification.

To answer these questions, functional coverage tools and methodologies have been developed that monitor the simulation processes and analyze the test programs, thereby generating a vast amount of data on what has been tested so far. In addition, some coverage analysis tools/methodologies allow the verification procedures to define models of classes of scenarios to be verified and/or enumerate all design states to be verified. These, in turn, result in "coverage holes" reports, which can tell what scenarios/states have not yet been simulated/verified. Verification procedures can then focus on the remaining verification holes.

The simulation process generates a large amount of data, which needs to be reviewed and processed each day on a continuous basis (24/7). Automatic random test generators running on a large network of computers can generate hundreds of thousands of tests each day resulting in several gigabytes of test data that must be filtered and analyzed each day. In addition, coverage models and analysis filters applied to the above tests generate gigabytes of functional coverage data each day. In many cases, the simulation data that is generated and its corresponding coverage data cannot be fully analyzed as fast as they are generated, resulting in:

1) A failure to extract all of the important coverage data from simulation database, thereby having an incomplete view of what has been simulated;

2) A failure to properly interpret the accumulated data to provide correct feed back to verification process based on accurate and complete coverage data;

3) Shallow analysis of simulated tests because coverage models/filters are not extensive enough nor do they deal with the tiered and temporal functional features and design constraints;

4) Many interesting functional scenarios and patterns go undetected because they are not reflected in the coverage models and, hence, not detected;

5) No data is generated or considered on correlations between models, since models are developed independently and coverage analysis tools and methods work with the output of models and no cross-model analysis capability is usually provided;

6) No new discovery is made based on the actual simulation or coverage data because the generated tests or coverage data are not analyzed as a whole from a temporal point of view or overall design progress point of view but rather in isolation one test at a time and one model at a time; and 7) Not all design changes are reflected in coverage models, since models are defined based on the test plans and design specs rather than the actual design itself.

Consequently, the verification bottleneck is now spread to test and coverage analysis as well. Not only is the verification an incomplete task, but also the coverage analysis is incomplete and requires additional resources of its own.

Focused and targeted verification coverage analysis requires dynamic adjustment of the analysis process based on a deep knowledge of test features and coverage analysis data, taking into consideration the trends and relevant patterns of the actual verification progress, as well as any known and expected patterns missing in the collected data. Unfocused coverage analysis generates reams of data and many shallow coverage reports, which usually do not reflect the actual attributes of the verification process. Expertise for development of coverage analysis models and effective utilization of coverage tools are scarce. Designers and verification engineers who are the best candidates to write effective coverage models and analyze coverage data because of their knowledge of the design's internal workings and details are usually too busy with their own traditional tasks. Therefore, a new and dynamic coverage analysis process is required.

A way is needed to convert gigabytes of data collected each day to useable knowledge. In addition, hidden attributes, trends, patterns, associations and relationships in the collected verification and coverage analysis data that may shed light on the actual behavior and progress of the verification process is usually not considered. Coverage analysis tools generate a variety of reports, presenting predefined coverage information, which usually show accumulated statistics rather than shifts in the trends or new behavior. Intelligent and methodical analysis based on deep knowledge of the verification process is required to turn continuous flow of test and coverage analysis data to readily usable and relevant information. What is required is design intelligence (DI) and verification intelligence (VI) rather than more data and more reports.

BRIEF DESCRIPTION OF THE INVENTION

Among the objectives of the present invention is the ability to analyze tests generated by any and all means and identify whether all design attributes and features to be verified have been successfully tested. If the features have not been tested, it determines what the test generators can do to remedy the shortcomings.

Another objective is to provide the capability for dynamically changing test specifications based on the analysis of tests that are generated and their contribution to the progress of functional verification (i.e. functional coverage), and to be able to observe, measure and respond to any consequences of any such changes.

Yet another objective is the automatic analysis of the state of a design verification and its progress based on implicit and explicit data extracted from various design and simulation databases, resulting in the automatic adjustments and optimizations of the test generation process, simulation environment, as well as the coverage models monitoring and measuring the verification progress.

The present invention relates to a system for providing coverage analysis of functional verification of integrated circuit designs, such as processor cores, embedded microprocessors, and general purpose microprocessors. The coverage analysis serves to detect functional verification trends and patterns and to report the same. The system comprises a number of components. These include a test generator that creates test programs using machine readable test attribute specifications. The test programs are developed by the test generator based on specifications that are received from a test spec generator. A simulator compares the test programs against the simulated behavior of design models. The inputs to the simulator are based on the development of deterministic tests and automatically generated tests. A program is included for mining and analyzing the simulation database, the program having the capability of providing feedback information for tuning these deterministic tests. The simulation database contains the results, traces, and logs of the simulation generated by the verification process. A program is used for mining and analyzing the simulation database. A database of all test programs generated by the test generators and engineers is created. A program is in place for mining and analyzing the test program database. Another database contains all functional coverage analysis data and coverage model results. A program is used for mining and analyzing the functional coverage database. The system also utilizes a program for analysis and monitoring of the coverage models and another program for the automatic generation of test specs from design HDL. A program is also employed for test spec adjustment and optimization. Another program is provided for creating architectural coverage models of the test programs. A functional coverage database is employed for storage of the created coverage models.

A coverage report is generated based on the information in the coverage database and the result of the analysis and mining of the said database wherein the actual verification process trends and patterns discovered are fed back to the test generator, to the coverage analysis environment, to the functional coverage database, and to the coverage report generator. The test spec generator receives feedback from the simulation traces database mining, the test program database mining, and the coverage database mining modules.

The system may also include a high level description of the design specification for the generation of machine readable coverage analysis models, a finite state machine and design state event extractor, and a coverage model generator using these as input to generate new coverage analysis models or update existing models.

The invention also includes a method for coverage analysis of functional verification of integrated circuit designs, such as processor cores, embedded microprocessors, and high performance microprocessors. The method includes the step of generating test programs using machine readable design specifications, and storing the test programs in a database. The test programs are created based on test specs. They are also based on feedback from the analysis and mining of the test programs database, the simulation traces database, and the functional coverage database. In the next step, the test programs are compared against the design models to produce simulation traces, and the resultant traces are stored in a database. This is followed by mining and analyzing the test program database and the simulation traces database. From this analysis, architectural coverage models and microarchitectural coverage models are created and are stored in a functional coverage analysis environment. Some of the architectural coverage models and microarchitectural coverage models are generated manually whereas other models are computer generated. The method may further include the steps of developing deterministic tests, and providing feedback to these, based on the mining and analysis of the simulation traces database. The analysis and mining of the coverage database is used to detect and report trends and patterns of interest for functional verification. Coverage reports are interpreted and made available to user via a plurality of interface devices and medium. Coverage directives are generated indicating tasks to be performed requiring certain skills and design knowledge. The generated reports, advisories, and directives are disseminated according to predefined methods and media protocols.

The invention further includes an article of manufacture comprising a computer usable medium having a computer readable program embodied in said medium, wherein the computer readable program, when executed on a computer, causes the computer to perform the following steps:

a) generate a test spec based upon predetermined design attributes, and forward the test spec to a test generator; b) create a test program based on the test spec and store the test program in a test programs database; c) forward each test program and manually generated tests to a simulator; d) simulate the test program and tests against the design model, and generate a trace of the simulation; e) store the traces in a simulation traces database; f) mine the simulation traces for patterns; g) mine data in the test programs database; h) analyze data received from the test programs database, the simulation traces database and from the database mining, and generate new models, if required, based on the presence or absence of a model; and i) store the models in a functional coverage database.

The computer readable program further causes the computer to generate design specs, and to generate coverage models based on these specs. The generated coverage models may be used based on the analysis of the test program database and the simulation traces database, and the mining of said databases.

BRIEF DESCRIPTION OF THE DRAWINGS

The present invention will now be described with specific reference to the drawings in which.

DETAILED DESCRIPTION OF THE INVENTION

The present invention relates to a system and a method that uses a combination of database mining algorithms and data analysis and optimization techniques such as classification and regression trees, neural networks, k-nearest neighbors, regression analysis and clustering algorithms to provide readily available and usable verification intelligence (VI). The proposed system and method turn raw data into VI and provide automatic extraction of the required data and attributes from existing verification and simulation databases—thus reducing the dependency on designers and verification personnel. In addition to standard database mining algorithms such as classification and regression trees, neural networks, k-nearest neighbors, regression analysis and clustering algorithms, Design FSM (Finite State Machine) extraction, design event extraction, coverage model tuning and management and automatic coverage model generation techniques are utilized to extract states, events and functional scenarios from design Hardware Description Language (HDL) specification and associated design, simulation and coverage databases. In addition, the proposed system provides mechanisms to automate the management and dissemination of VI via various communication medium (email, pager, Website, reports, . . . ). An integrated web-based database access and management portlet allows a single point of access and analysis to all corresponding databases across Intranet and Internet.

Here is a partial list of the features of this system:

Automatic coverage model generation from design specification HDL

Identify and extract primary design interfaces (Input and output ports), temporal attributes and functional sequences Identify and extract internal design interface signals, communication protocol attributes and functional constraints and dependencies, Classify design signals, attributes and functions based on design hierarchy references, and . . .

Automatic coverage model generation from valid scenarios not covered by any existing models Dominant patterns and sequences in the coverage database are converted to models Such models can be used to filter data (valid but not interesting or relevant)

Stop generation of test programs contributing only to such models to improve test generation and simulation Feedback loop to test generators and simulators to reprioritize resource allocation Automatic coverage model parameter tuning based on design changes, actual functional verification progress, discovered design bugs, and dominant verification trends Fuzzy coverage estimation of incomplete scenarios and scenarios with partially masked fields (e.g. undecided features, confidential features not released by customer, . . . )

The proposed system and method converts coverage data into useful coverage metrics, coverage models and coverage reports and in turn provides verification environment management and resource optimization.

Figure 3:
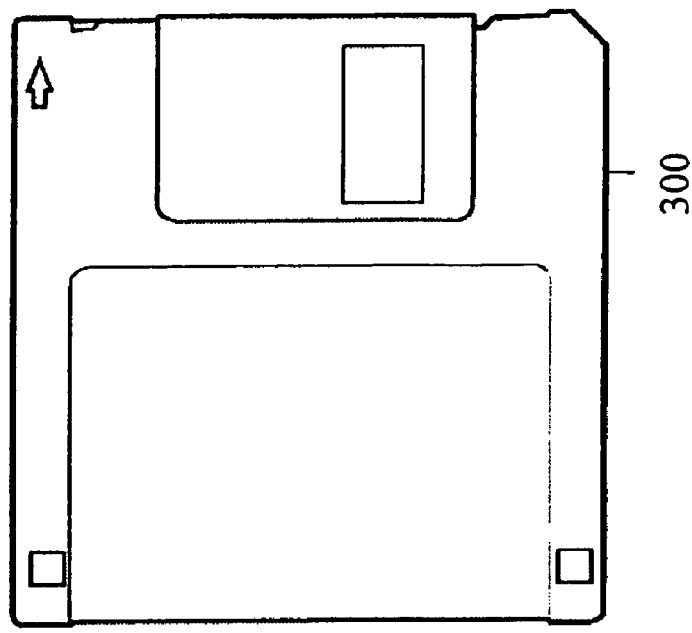
FIG. 3 represents a computer medium useful with the current invention.
Figure 1:
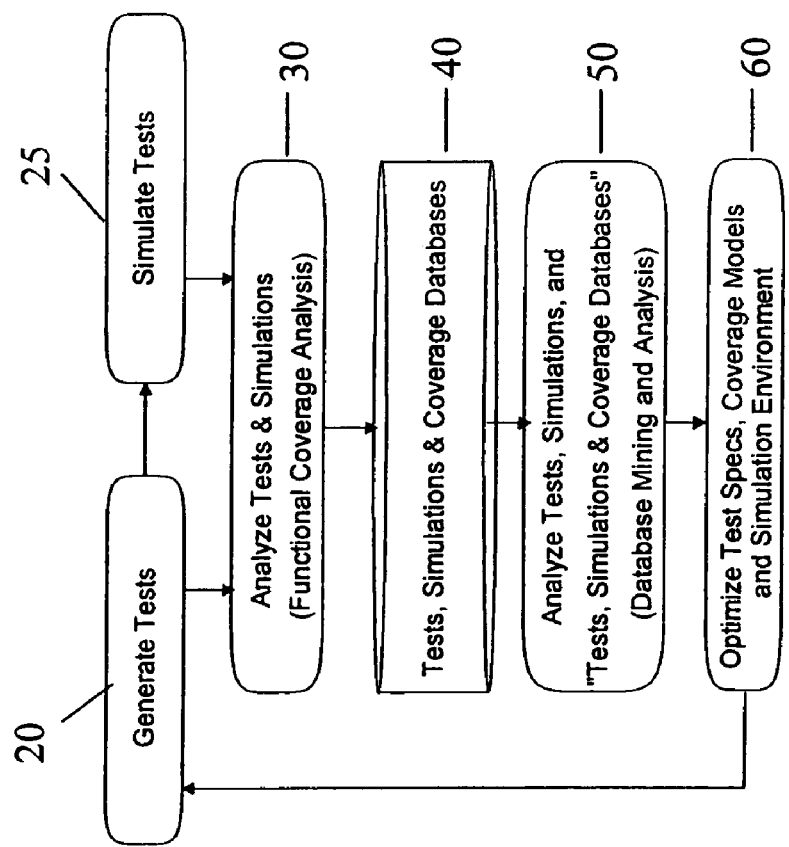
FIG. 1 is an overview of the system architecture.

Turning now to the drawings, FIG. 1 is a diagram showing the high level view of a typical system architecture according to the present invention. Tests are generated in step 20, and are simulated in step 25. Both the generated tests 20 and the simulation results, traces and logs 25 are analyzed in step 30. The results of this analysis, as well as the generated tests and simulation results, traces and logs are stored in various databases 40. These databases include a Test Program Database, a Functional Coverage Database and a Simulator Traces Database, all shown in FIG. 2. These various databases, tests and coverage models are further analyzed and the databases are mined at 50 and tests, coverage models and simulation environment parameters are optimized at 60. The optimized results are recycled to the test generation and simulation steps 20 and 25.

Figure 2:
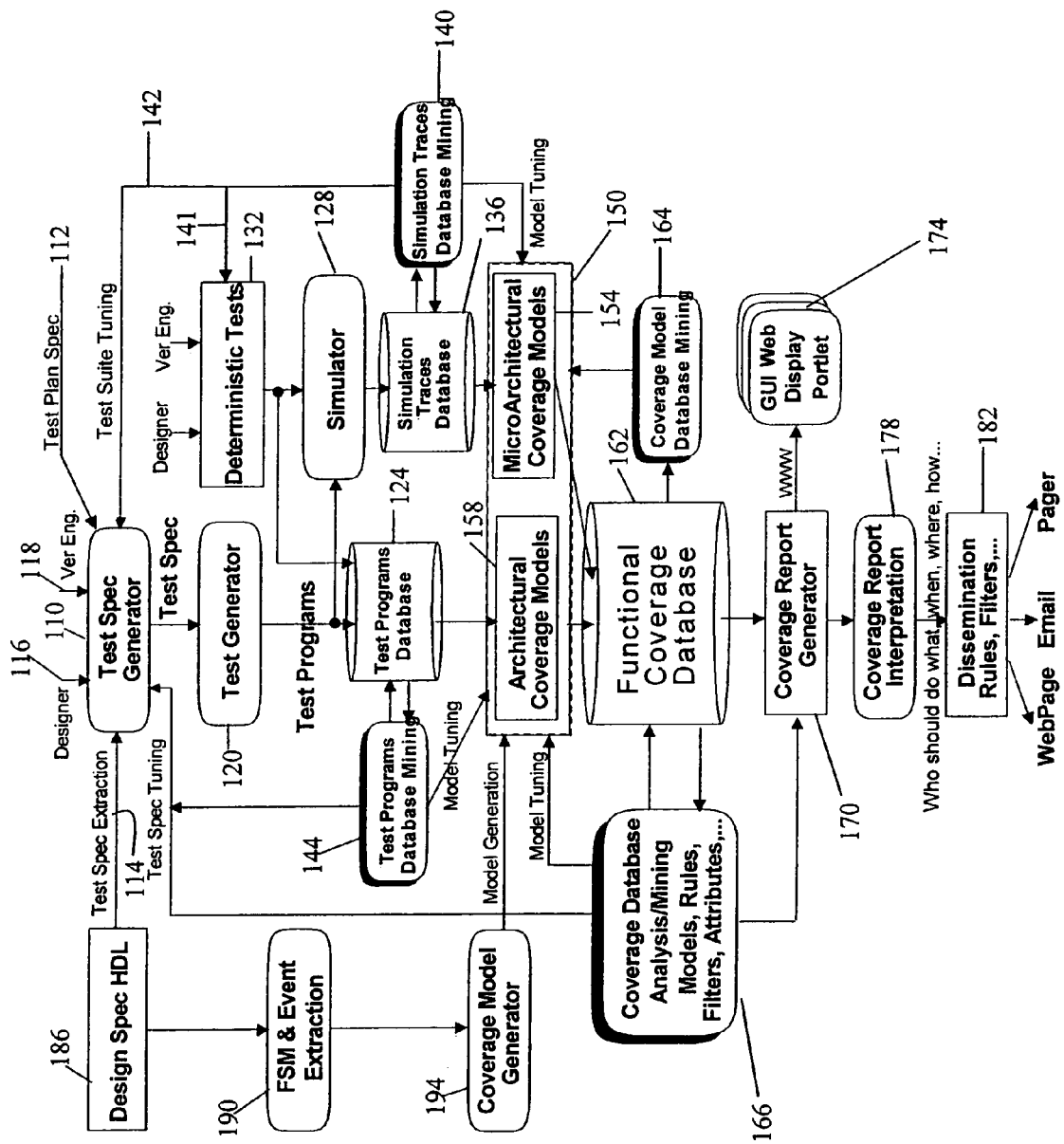
FIG. 2 is the detailed system architecture and functional flow diagram.

FIG. 2 is a diagram showing a typical system architecture according to the present invention.

The microprocessor functional verification starts with defining and generating tests (i.e. test programs). These are programs that are then executed against a reference design model to ensure design's functionality. The attributes and properties of desired tests are provided as input to a Test Spec Generator (TSG) 110. TSG converts the desired test attributes to appropriate test specification suitable for the test generators (random, pseudo random, targeted, . . . ) used in the verification process. The goal is to generate as much different variety of tests as possible to insure that all aspects of a new design have been verified. The input to TSG may include data that is generated automatically as well as data that is manually generated by designers 116 or verification engineers 118. Input to TSG can be extracted automatically from test plans 112 or from the structural analysis of the design HDL 114.

The TSG 110 takes all the various inputs from the human designers, the systems, the documents, etc., and generates a specific Test Spec in a format suitable for a variety of Test Generators 120 deployed in the verification process.

The Test Generator 120 takes the Test Spec and creates test programs having certain features or characteristics in order to meet the attributes and properties included in the input Test Spec. Such Test Specs for example may include data and address ranges, list of desired attribute types, functions, or constraints. Therefore, a random test generator would try to cover the requirements in a series of tests. For example, the Test Spec might request collisions for a cache. Test generator would create tests that generate read-write, write-read, write-write and read-read collisions for all valid data block sizes across all valid cache addresses. These are all the different features wanted in this test. The Test Generator 120 generates a set of tests which are send to the simulator 128 as well as stored in the Test Programs Database 124 which basically is a central storage for all of the tests generated and simulated.

The test program after it is generated is directed to the Simulator 128 on the right hand side of the diagram. Here, the program is simulated against the design model to see whether the design would pass or fail the test. If the design fails the test, then the fail reason must be determined.

Another input to the Test Simulator is the Deterministic Test in the box 132 above the simulator 128. There are two different types of tests that go to the Simulator 128. These are the tests that are automatically generated from the test specs by test generators 120. Also test that are generated manually by design or verification engineers to verify a specific condition, which perhaps can't be generated automatically, or the engineers don't know how to define the requirements to the test generator 120. So in either case the Simulator 128 takes test cases, whether manually generated meaning Deterministic Tests 132 or automatically generated meaning from the Test Generator 120 and simulates them.

When a test is simulated, the Simulator 128 generates traces or simulation logs which include the initial assumptions used for initiating the simulation session, intermediate steps as each instruction in the test is simulated and the final results which would include all values that changed in design due to the execution of the test. Corresponding simulation traces and logs for all tests whether passed or failed are stored in the Simulation Traces Database 136 for further analysis and database mining. Some simulators generate standard format traces such as Value Change Dump (VCD) and other generated textual trace files for each simulation session. The Simulator usually initializes the simulation session to a defined state according to the test spec or a random initial state and then executes the test and after each step (or prescribed actions), the simulator identifies whether anything has changed in the design state and makes a note of the changes as intermediate design state changes which are usually recorded in the simulation traces, as well as propagated to the design model. At the end of the simulation session the simulation trace containing all design state changes, as well any simulation logs containing the fate of the test are directed to the Simulation Traces Database 136.

Simulation Traces Database Mining module shown in box 140 applies appropriate database mining and analysis algorithms and methods such as k-nearest neighbors, and clustering algorithms to identify new trends, as well as dominant patterns and attribute sequences in the Simulation Traces Database 136. In addition the most common trace patterns, the most common pattern sequences, and the patterns that happen very infrequently are also identified by applying appropriate database mining and analysis algorithms and methods such as k-nearest neighbors, regression analysis and clustering algorithms 140. When looking at millions of traces and noting that some patterns have only happened a few times, whereas other patterns have happened many times, that means that those patterns that have happened very few times are under tested and under utilized. This basically gives insight into what area of verification and test generation may need more attention. Knowing what test attributes (simulation traces) have happened infrequently in tests that have passed but frequently in tests that have failed is a great insight for debugging the design, as well as valuable hints on the type of test attributes that need to be mixed with the generated tests. And that is where the Simulation Traces Database Mining box 140 can make major contribution to the verification progress. From the patterns that are observed, conclusions are drawn and feed back to the Test Spec Generator 110 as Test Spec tuning 142 as well as feed back to Deterministic Tests 132 as Test Suite Tuning 141. Thus, these verification procedures insure that enough attention has been paid to all aspects of the design because of the tendency to test the easiest aspects thoroughly while giving little attention or no attention at all to the more complex scenarios. And the advantage of applying database mining and analysis techniques at the simulation trace level is to identify the actual progress and exhibited behavior of the verification process. Thus, the trace mining report may observe that a given scenario was tested only a few times even though a large number of simulated tests should have created that scenario. And if the results are not what were intended, then there may be defects with the test generation or Test Spec specification or Test Spec generation. Existing verification methodologies would not be able to get such an insight into the actual inner working of the verification process. In addition, the Simulation Traces Database Mining module 140 can identify rare tested conditions indicating the need for additional class of tests to be generated.

To the left of the Test Programs Database box 124 is a box 144 labeled Test Programs Database Mining. Test specs serve as input to the Test Generator 120 to generate tests that have required special characteristics based on the test spec inputs. The Test Generator 120 does its best to create the tests satisfying all or as many of the required specifications as possible. Test generators are not always able to generate the exact required tests because of some conflicts that can not be resolved or because their internal generation algorithms may not converge in the permitted time. Test Programs Database mining module 144 applies appropriate database mining and analysis algorithms and methods such as regression analysis and clustering algorithms to the Test Programs Database 124 to determine whether an evenly distributed test signature is present or whether there are test generation biases (frequent patterns, rare patterns, missing pattern sequences). Any new discovery is fed back to Test Spec Generator 110 in the form of Test Spec Tuning. This will result in updated Test Specs or new Test Specs, which will enable the Test Generator 120 to generate appropriate test patterns or test features. This feed back and tuning process is directed by the insight into the inner working of the test generator as well as insight into the design itself. The database mining is usually used for analyzing and finding relationships between the information in the database, but it can also be used to find a lack of a relationship. The Test Generator can then be instructed to adjust its generation process by adjusting the test spec fed to it in order to make sure that the type of tests required are generated. If such a generation falls outside of the test generator capability, appropriate advisory reports are generated. Thus, even though the test generation might have been successful and the test passed simulation, the Test Programs Database Mining 144 can detect if the test does not include all of the requested features. This test program database analysis is conducted before the test programs are simulated, which could stop the simulation of redundant, incorrect, and incomplete tests.

In addition to Test Spec Tuning feed back generated by Simulation Traces Database Mining 140 and Test Programs Database Mining 144, coverage analysis model tuning directives are also generated by both 140 and 144. These Model Tuning directives are fed to Coverage Analysis Environment 150. The Coverage Analysis Environment model optimization routines will then identify whether the received information is applicable to Architectural Coverage Models 158, Microarchitectural Coverage Models 154 or both and make the appropriate adjustments. For example, the Model Tuning directives generated by the simulation traces database mining 140 may apply to both architectural and microarchitectural models. Model Tuning directive from Test Programs Database Mining 144 are usually applicable to the Architectural Coverage Models 158.

One of the important features of database mining is pinpointing relationships that are present in the Test Program Database 124 or Simulation Traces Database 136 but were not planned for nor anticipated. Identifying patterns or attributes in the databases which can not be accounted for based on the test specs and simulated tests, indicate that there are some valid design features missing in the verification plan or perhaps there are some unknown (unanticipated) test generator capabilities. Any such discovery will be fed back to Test Spec Generator 110, Deterministic Tests 132, as well as Coverage Analysis Environment 150.

The Simulation Traces Database Mining 140 and the Test Programs Database Mining 144 can be used to make sure not only that planned test and simulation patterns are present but also to identify patterns that were not anticipated or planned for such as unusual relationships, sequences, patterns and biases. This information is fed to Coverage Analysis Environment 150 as Model Tuning. Three Model Tuning arrows are shown from the Simulation Traces Database Mining 140, the Test Programs Database Mining 144, and the Coverage Database Analysis Mining 166. All of these are feedbacks from the database mining and database analysis. If a scenario, feature or relationship is found that was not initially modeled, meaning that it may have been overlooked, it is submitted to the modeling environment 150, so a model specification is generated which would result in either automatic generation of one such coverage analysis model or a request is sent to the responsible verification engineer. This may result in upgrade of an existing model to ensure additional scenarios, feature or relationship is monitored by the model or new coverage analysis models may be required. In some instances, such a feedback would identify non-functional models—models that should have caught the listed scenario, design feature or feature relationship but did not because of incorrect modeling or wrong assumptions. In some instances, the scenario, design feature or feature relationship are coverage exceptions (Features that are not implemented in the design and therefore should be excluded in the coverage analysis and should have never been simulated successfully). This class of discovered attributes are in fact design errors that escaped the verification process indicating an error in the simulation model. Thus, the database mining in the present invention is used to find scenarios, relationships and features that are known, or that should exist. It is also used to identify if these in fact have occurred and are present in one of the databases. Database mining is also used to identify relationships, scenarios and patterns that have not been contemplated or that should not happen. All three cases again are sent back into the modeling environment 150 with some of the model tuning directives only applying to architectural models 158 and some of them applying only to microarchitectural models 154, while others may apply to both.

For purposes of the present invention, it should be understood that the Architectural Coverage Models 158 deal with the architectural features of the design, such as instruction set, register set, caches, pipelines, data ranges, address ranges, data conversion features, branch management features, etc. The Microarchitectural Coverage Models 154 on the other hand address the underlying micro operations and functions. Microarchitectural coverage models 154 ensure these internal subcomponents and hidden layers of the design are verified. These models monitor the inner working and temporal dependencies of the design.

The Architectural Coverage Models 158 mainly apply to the tests (automatically generated as well as deterministic tests) whereas the microarchitectural coverage models 154 mainly are applied to simulation results of the tests which includes more detailed internal working of the design, signal values and system status condition changes.

Coverage analysis environment 150 applies coverage models to tests coming to Test Program Database 124, as well as simulation traces and dumps coming to Simulation Traces Database 136. The results generated by the models as well as analysis logs and traces generated by the Coverage Analysis Environment 150 are stored in the Functional Coverage Database 162. The information stored in 162 includes list of models fired (activated) for each test, components of each model fired for each test, and incorrect features observed by a model (exceptions that should have not happened). In addition, each model has a corresponding set of counters keeping track of the number of times the model and its specific components have been activated. For example, if model A has 10 components (10 design features or scenarios to be tracked), there will be at least 11 counters associated with it (model-a, a1, a2, a3, . . . a10), where model_a and a# counters are incremented each time a model attribute (a#) is observed. In addition there will be an associated cross reference table which would include the name of the tests that triggered the model. Some implementations may only save the name of the first and last tests, to manage the size of the corresponding databases. All such relationships and information (depending on the deployed methodology) will be maintained in the Functional Coverage Database 162.

In addition to the coverage analysis models 150 which are applied to Test Programs Database 124 and Simulation Traces Database 136, there are also a set of models and filters used for analysis of Functional Coverage Database 162 content. The Coverage Database Analysis and Mining Models, Rules, Filters and Attributes 166 analyze and evaluate the Functional Coverage Database 162 itself. In addition to applying appropriate database mining and analysis algorithms and methods to this database similar to functions performed by 140, 144 and 164, Coverage Database Analysis and Mining 166 also performs maintenance and optimization routines on this database. For example, it can identify models that have very similar signature which may indicate duplicate or redundant models. It can also identify models that complement each other (i.e. logical intersection of model A and model B is null), which can identify models that can be combined. The Coverage Database Analysis and Mining module 166 can also identify frequently hit models which may indicate models that are very shallow or too general. The function 166 also analyzes database 162 to identify correlations, dependencies and behavioral trends and associations among models. The result of Coverage Database Analysis 166, as well as the result of Coverage Model Database Mining 164 are fed back to the Coverage analysis Environment 150 for coverage model adjustment and optimization, as well as removing redundant models and creating missing ones. In addition, the result of Coverage Database Analysis 166 is also fed back to the Test Spec Generator 110 for adjustments to Test Specs and to Coverage Report Generator 170 to generate appropriate advisories and directives for actions that require attention from engineers. The model Tuning directives generated by 166 will guide 150 to make necessary operational adjustments in response to the behavior and patterns observed in 162. For example, if one hundred models are maintained in the Database 162 and 95 of these 100 models have been fired (activated) very frequently, but 5 of them have hardly been activated, this indicates that there are inherent biases in the test generation process that have ignored the design attributes monitored by these neglected models or there might be some problems with the Test Spec Generator 110 or perhaps missing or inadequate Test Specs. Therefore, resources and expertise should be devoted to this set of models and their corresponding tests and verification tasks. A closer investigation is required to identify the cause of this neglect. Maybe there are not enough tests for it, maybe it is in a part of the design that requires a special feature to be exercised, or requires specific sequences of functions and system status conditions. Sometimes such a discovery points to weaknesses in the verification methodology where some aspects of the design are not paid enough attention. In other times, it may indicate design features that were added but not documented, or specific implementation detail not available in the design specification.

Therefore, as it has been described in the previous sections, database mining techniques are used to identify aberrations in the test generation, simulation, and coverage analysis tasks in order to bring to focus parts of verification process that need attention. That is one of the strength of database mining which is missing from the traditional functional verification and coverage analysis tools and methodologies. And again this is important because these are high level process behavior that are not reflected in the coverage models or simulation results. Coverage models usually identify and count items of interest but can not provide any insight into what might have happened in the scope of the entire verification process. Simulation can only tell us whether a test failed or passed and does not keep track of previous simulations or incomplete tasks. Using database mining techniques in conjunction with the traditional model-based functional coverage analysis provides a deeper insight into the overall verification progress, as well as the not so obvious biases and shortcomings of the verification methodology.

The coverage models by themselves do not keep track of all relevant and peripheral events that might have happened simultaneously in conjunction with the events they are tracking. Nor do they monitor or can monitor whether anything unexpected or illegal also happened in other models. And that is where the database mining techniques can make unique contribution to improving the overall verification process efficiency and quality.

The Coverage Report Generator 170 extracts information from the Functional Coverage Database 162 and generates statistical reports, usage reports, frequency reports and many other coverage reports. It also takes input from the Coverage Database Analysis . . . 166 to generate correlation, dependency, and relationship reports for the coverage models. All of these coverage reports and others that can be generated from 166 and 162 are then made available to engineers via the Web-based Graphical User Interface Display Portlet 174. This Portlet similar to a Java applet in concept provides a programmable facility for dynamically generating and customizing display objects, such as graphs, images, charts, etc. Portlets are Java-based Web components, managed by a portlet container, that process requests and generate dynamic content. The disclosed system and method uses portlets as programmable user interface components that provide a presentation layer to the compiled and the generated information. This Display Portlet 174 can be accessed from internet as well as intranet and will automatically customize the data and display objects for the user preferences and requirements, such as language, display schema, colors, presentation type (audio, video, text, . . . ), etc. providing a modular and user-centric data presentation mechanism. 174 also provides support for remote and local, as well as wired or wireless user devices. It also provides interaction protocols for future interface device integration and support. In addition, 174 provides mechanisms for user security and identity management, as well as On-Demand information generation and dissemination.

Coverage reports and analysis data produced by generator 170 are analyzed by the Coverage Report Interpretation 178 in the context of the verification progress, available user profiles, types of verification directives available, project profile and the available expertise (engineers). The Coverage Report Interpretation 178 generates specific design and verification directives on who should do what task, using which tools and how. The generated design and verification directives are then disseminated to appropriate engineers based on the predefined rules and protocols 182.

An yet another aspect of this disclosure is the methods by which some of the coverage models and test specifications can be generated automatically. The Design Spec HDL 186 is the design specification in a suitable HDL language or format such as VHDL, Verilog, SystemVerilog, SystemC, etc. From structural analysis of the Design HDL 186 some architectural and microarchitectural features of the design can be extracted and converted to Test Specification 114. In other words, once a design feature is extracted from Design HDL 186, it can be used as a Test Spec hint or requirement input 114 to Test Spec Generator 110. In addition, methods are deployed that would extract (or estimate) a design FSM (Finite State Machine), state tables, and functional events 190 automatically from the Design HDL 186. Then the corresponding ordered list of events, the sequence of events, and the list of forbidden events can be generated and made available to the Coverage Model Generator 194. These are coverage analysis models that are generated automatically and are then passed to either the Architectural Coverage Models 158 or Microarchitectural Coverage Models 154 modules. This is in addition to all the models generated manually by design and verification engineers. Some of the coverage models can only be defined by the design and verification engineers who have intimate knowledge of the design intent and its specific implementation. And some of the coverage analysis models can be generated automatically as described above. This capability is specially beneficial when the design specs change, and the design or verification engineer may not be up to date with the changes in the design specs because of the changes initiated by the customer, marketing or the architect. So, such an automation provides mechanisms to insure that if there are new features added to the design spec, or any design spec changes, that they are taken into consideration and corresponding models are generated to encompass the changes and these models are placed into the coverage model analysis environment 150.

Tests are generated in step 20, and are simulated in step 25. Both the generated tests 20 and the simulation results, traces and logs 25 are analyzed in step 30. The results of this analysis, as well as the generated tests and simulation results, traces and logs are stored in various databases 40. These databases include a Test Program Database, a Functional Coverage Database and a Simulator Traces Database, all shown in FIG. 2. These various databases, tests and models are further analyzed and the databases are mined at 50 and tests, coverage models and simulation environment parameters are optimized at 60. The optimized results are recycled to the test generation and simulation steps generator steps 20 and 25.

While the invention has been described in combination with specific embodiments thereof, there are many alternatives, modifications, and variations that are likewise deemed to be within the scope thereof. Accordingly, the invention is intended to embrace all such alternatives, modifications and variations as fall within the spirit and scope of the appended claims.

What is claimed is:

1. A database mining method for coverage analysis of functional verification of integrated circuit designs comprising the steps of
    a) generating test programs using machine readable design specifications, and storing specifications of the test programs in a test program database for mining pattern relevancy and dependencies;
    b) comparing the test programs against design models to produce simulation traces, and storing the resultant traces in a simulation traces database for mining relationships, relevancy and dependencies among traces;
wherein the method further includes:
c) mining and analyzing the test program database and the simulation traces database;
d) developing deterministic tests, and providing feedback to these tests, based on the mining and analysis of the simulation traces database;
e) creating architectural and microarchitectural coverage models based on the test programs and the simulation traces, and
f) storing the models in a functional coverage analysis environment.

2. The method according to claim 1 further including the use of the analysis and mining of the functional coverage database to detect and report trends and patterns of interest to verification.

3. The method according to claim 2 wherein some of the architectural and microarchitectural coverage models are generated manually whereas other models are computer generated.

4. The method according to claim 1 wherein coverage reports are interpreted and made available to user via a plurality of interface devices and medium.

5. The method according to claim 4 wherein coverage directives are generated indicating tasks to be performed requiring certain skills and design knowledge.

6. The method according to claim 5 wherein generated reports, advisories, and directives are disseminated according to predefined methods and media protocols.

7. The method according to claim 1 further including the generation of test specifications for design hardware description language (HDL).

8. The method according to claim 7 further including adjustment and optimization of test specifications.

9. The method according to claim 7 further including the step of converting dominant patterns and sequences into the architectural and microarchitectural coverage models.

10. The method according to claim 1 including the step of making fuzzy estimations of incomplete and partially masked fields.

11. The method according to claim 1 including the step conducting a test program database analysis preceding test program simulation.

12. The method according to claim 7 including the step of extracting a architectural or microarchitectural design feature from the design HDL and converting the feature to a test spec input to a test spec generator.

13. An article of manufacture comprising a computer usable medium having a computer readable program embodied in said medium, wherein the computer readable program, when executed on a computer, causes the computer to:
a) generate a test specification based upon a predetermined design model, and forward the test specification to a test generator,
b) create a test program based on the test specification, and store the test program in a test programs database;
c) forward each test program and manually generated tests to a simulator;
d) simulate the test program and the generated tests against the design model, and generate a trace of the simulation;
e) store the trace in a simulation traces database;
f) mine the simulation traces for patterns;
g) mine data in the test programs database;
h) analyze data received from the test programs database, the simulation traces database and the database mining, and generate new models if required, based on the presence or absence of a model;
i) store the new models in a functional coverage database;
j) use the new models based on the analysis of the test program database and the simulation traces database, and the mining of said databases.

14. The article of manufacture according to claim 13 wherein the computer readable program further causes the computer to generate design specifications, and to generate coverage models based on these specifications.

15. The article according to claim 13 wherein the computer readable program creates architectural and microarchitectural coverage models based on the analyzed data received from the test programs database and the simulation traces database.

* * * * *